United States Patent
Choi et al.

(10) Patent No.: US 12,047,720 B2
(45) Date of Patent: Jul. 23, 2024

(54) CRADLE AND PORTABLE SOUND DEVICE

(71) Applicant: LG ELECTRONICS INC., Seoul (KR)

(72) Inventors: Sungin Choi, Seoul (KR); Eujin Kim, Seoul (KR); Wonseok Joo, Seoul (KR); Jungyun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 196 days.

(21) Appl. No.: 17/714,579

(22) Filed: Apr. 6, 2022

(65) Prior Publication Data
US 2023/0067147 A1 Mar. 2, 2023

(30) Foreign Application Priority Data

Aug. 26, 2021 (WO) ................ PCT/KR2021/011438

(51) Int. Cl.
*H04R 1/02* (2006.01)
*H04R 1/10* (2006.01)
(Continued)

(52) U.S. Cl.
CPC ............. *H04R 1/02* (2013.01); *H04R 1/1016* (2013.01); *H04R 5/033* (2013.01); *H05K 5/0221* (2013.01);
(Continued)

(58) Field of Classification Search
CPC ........ H04R 1/02; H04R 1/1016; H04R 5/033; H04R 2420/07; H04R 1/1025;
(Continued)

(56) References Cited

U.S. PATENT DOCUMENTS

2008/0090622 A1 4/2008 Kim et al.
2017/0195760 A1* 7/2017 Tang ...................... A45C 11/00
(Continued)

FOREIGN PATENT DOCUMENTS

CN 211860506 11/2020
KR 1020190000874 1/2019
(Continued)

OTHER PUBLICATIONS

PCT International Application No. PCT/KR2021/011438, International Search Report dated May 23, 2022, 13 pages.
(Continued)

*Primary Examiner* — Oyesola C Ojo
(74) *Attorney, Agent, or Firm* — LEE, HONG, DEGERMAN, KANG & WAIMEY

(57) ABSTRACT

A cradle includes a main body having a seating portion in which an earbud is seated, a folder body capable of being converted between a closed state and an opened state of the seating portion, and a hinge portion configured to couple the folder body to the main body, wherein the hinge portion includes a first hinge coupled to the main body, a second hinge coupled to the folder body, a shaft extending through the first hinge and the second hinge, a first magnet coupled to the first hinge, and a second magnet coupled to the second hinge or to the folder body, and wherein the first magnet and the second magnet maintain a repulsive force therebetween while the folder body is converted into the opened state from the closed state. The semi-automatic opening structure of the cradle is simplified so as to simplify the manufacturing process and reduce manufacturing costs.

17 Claims, 10 Drawing Sheets

(a)

(b)

(51) Int. Cl.
*H04R 5/033* (2006.01)
*H05K 5/02* (2006.01)

(52) U.S. Cl.
CPC ....... *H05K 5/0226* (2013.01); *H04R 2420/07* (2013.01)

(58) Field of Classification Search
CPC .. H05K 5/0221; H05K 5/0226; A45C 13/005; A45C 2011/001; A45C 13/1069; H02J 7/0044
See application file for complete search history.

(56) References Cited

U.S. PATENT DOCUMENTS

| | | | | |
|---|---|---|---|---|
| 2019/0069066 | A1* | 2/2019 | Song | E05C 19/16 |
| 2020/0304897 | A1* | 9/2020 | Cohen | H04R 1/02 |
| 2021/0058687 | A1* | 2/2021 | Liu | H02J 50/10 |
| 2021/0152912 | A1* | 5/2021 | Chawan | H02J 7/0044 |
| 2021/0281942 | A1* | 9/2021 | Feng | H04R 1/1033 |
| 2021/0345742 | A1* | 11/2021 | Wright | A45C 11/00 |
| 2022/0224167 | A1* | 7/2022 | Jang | H04R 1/1016 |
| 2022/0369008 | A1* | 11/2022 | Kim | H04R 1/1025 |
| 2023/0254625 | A1* | 8/2023 | Lin | H02J 7/00 320/107 |

FOREIGN PATENT DOCUMENTS

| | | |
|---|---|---|
| KR | 1020190021033 | 3/2019 |
| KR | 1020190115962 | 10/2019 |
| KR | 102166637 | 10/2020 |

OTHER PUBLICATIONS

European Patent Office Application Serial No. 22167419.5, Search Report dated Sep. 23, 2022, 13 pages.

* cited by examiner (a)

(b)

(a)

(b)

(a)

(b)

(a)

(b)

(c)

(a)

(b)

(a)

(b)

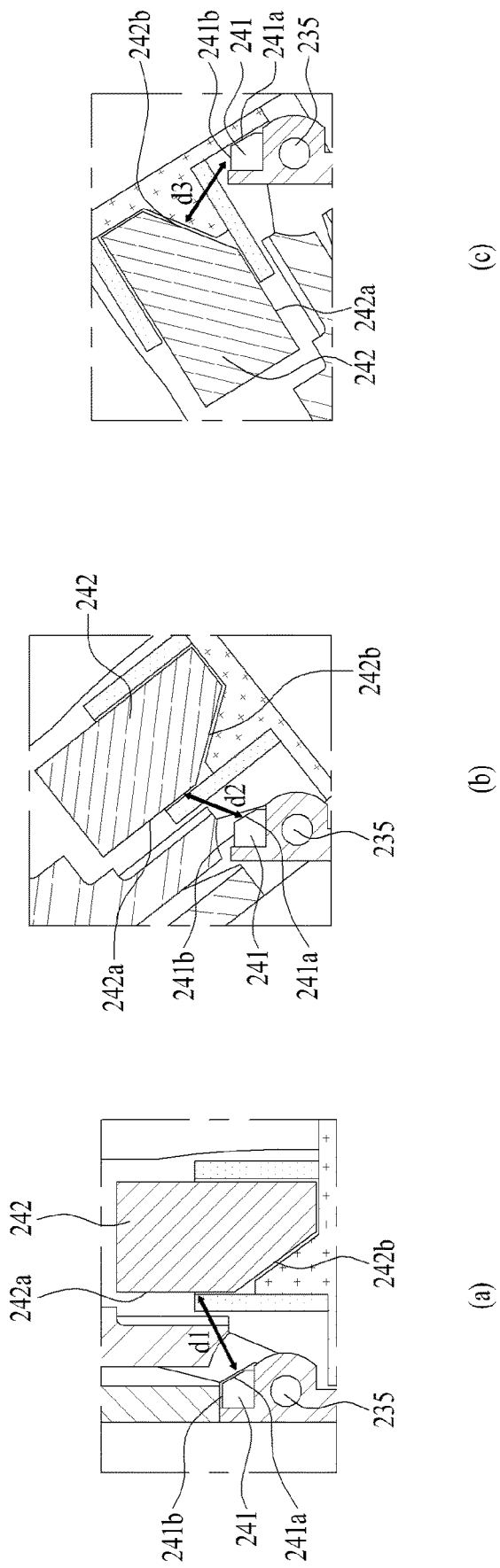

CRADLE AND PORTABLE SOUND DEVICE

CROSS-REFERENCE TO RELATED APPLICATIONS

Pursuant to 35 U.S.C. § 119, this application claims the benefit of an earlier filing date and right of priority to International Application No. PCT/KR2021/011438, filed on Aug. 26, 2021, the contents of which are hereby incorporated by reference herein in its entirety.

BACKGROUND

Field

The present disclosure relates to a cradle configured to receive earbuds therein and portable sound device including the cradle.

Discussion of the Related Art

"Portable sound device" refers to a sound device configured to receive a sound signal from a terminal device and to transmit sound information collected through a microphone to the terminal device. Conventionally, portable sound devices have adopted wired communication technology in which a terminal of a portable sound device is inserted into an ear port of a terminal device so as to receive sound signals. Recently, demand for wireless-communication-type portable sound device is increasing due to convenience in mobility and use thereof.

A portable sound device may be provided with a sound output unit in order to fulfill various functions, including those of music reproduction, telecommunications and the like. Such a portable sound device is capable of being connected to a base station by itself for telecommunication or of being directly connected to an external server so as to receive sound data. In addition, such a portable sound device is capable of fulfilling the above functions by being paired with another terminal device.

Portable sound devices, including a headphone-type portable sound device configured to have a band shape so as to be worn on a user's head, an ear-hook-type portable sound device, and an ear-fit-type portable sound device, which are designed in consideration of portability, have been developed.

Particularly, an earbud-type portable sound device, which is designed to fit into user's ear and to transmit sound to the user's ears in response to output sound signals, is capable of being stored in a case called a "cradle" and of being charged. In order to allow a pair of earbuds to be easily taken out of the case to be worn, the cover of the cradle must be capable of being opened and closed. Furthermore, there is need for a cradle designed to have minimal size for portability.

SUMMARY

An object of the present disclosure is to provide a cradle including a cover capable of being opened and closed in a semi-automatic manner and a portable sound device including the cradle.

In order to accomplish the above object, an aspect of the present disclosure provides a cradle including a main body having a seating portion in which an earbud is seated, a folder body capable of being converted between a closed state in which the folder body covers the seating portion and an opened state in which the folder body opens the seating portion, and a hinge portion configured to hingedly couple the folder body to the main body, wherein the hinge portion includes a first hinge coupled to the main body, a second hinge coupled to the folder body, a shaft extending through the first hinge and the second hinge, a first magnet coupled to the first hinge, and a second magnet coupled to the second hinge or the folder body, and wherein the first magnet and the second magnet are disposed so as to maintain a repulsive force therebetween while the folder body is converted into the opened state from the closed state.

The first magnet may be coupled to the first hinge close to the shaft.

The distance between the first magnet and the second magnet may be minimized in an intermediate state between the closed state and the opened state.

The first magnet may include a first surface and a second surface each having a first polarity, the first surface and the second surface defining an obtuse angle of more than 90° therebetween, and the second magnet may include a third surface and a fourth surface each having the first polarity, the third surface and the fourth surface defining an obtuse angle of more than 90°.

The first surface and the third surface may face each other in the closed state, and the second surface and the fourth surface may face each other in the opened state.

The shaft may be positioned at the folder body.

The first hinge may include a first portion coupled to the main body and a second portion projecting toward the folder body, and the shaft may be coupled to the second portion of the first hinge.

The second hinge may include a third portion, which is positioned parallel to the second portion and through which the shaft extends, and a fourth portion, which extends from the third portion and is fixed to the folder body.

The folder body and the main body may define an angle greater than 90° therebetween in the opened state.

The hinge portion may include a metal material.

The hinge portion may be positioned at one side of the main body, and the cradle may further include a wireless charging antenna positioned at the one side of the main body.

Another aspect of the present disclosure provides a portable sound device including a pair of earbuds each having a sound output unit, and a cradle having seating portions in which the pair of earbuds are seated, wherein the cradle includes a main body having formed therein the seating portions, a folder body capable of being converted between a closed state in which the folder body covers the seating portion and an opened state in which the folder body opens the seating portion, and a hinge portion configured to hingedly couple the folder body to the main body, wherein the hinge portion includes a first hinge coupled to the main body, a second hinge coupled to the folder body, a shaft extending through the first hinge and the second hinge, a first magnet coupled to the first hinge, and a second magnet coupled to the second hinge or the folder body, and wherein the first magnet and the second magnet are disposed so as to maintain a repulsive force therebetween while the folder body is changed into the opened state from the closed state.

The first magnet may be coupled to the first hinge close to the shaft.

The distance between the first magnet and the second magnet may be minimized in an intermediate state between the closed state and the opened state.

The first magnet may include a first surface and a second surface each having a first polarity, the first surface and the second surface defining an obtuse angle of more than 90° therebetween, and the second magnet may include a third surface and a fourth surface each having the first polarity, the third surface and the fourth surface defining an obtuse angle of more than 90° therebetween, wherein the first surface and the third surface face each other in the closed state, and the second surface and the fourth surface face each other in the opened state.

The pair of earbuds may project partway out of the seating portions, and the folder body and the main body may define an angle greater than 90° therebetween in the opened state.

The additional scope within which the present disclosure is applicable will be apparent from the following detailed description. However, since various alternatives, modifications, equivalents and other embodiments that are included within the spirit and scope of the present disclosure will be appreciated by those skilled in the art, the detailed description and specific embodiments, such as preferred embodiments of the present disclosure should be construed as merely illustrative.

BRIEF DESCRIPTION OF THE DRAWINGS

FIG. 10 is an enlarged view illustrating orientation of the first magnet and the second magnet in the stages shown in FIG. 9.

DETAILED DESCRIPTION

A description will now be given in detail according to exemplary embodiments disclosed herein, with reference to the accompanying drawings. For the sake of brevity of description with reference to the drawings, the same or equivalent components may be denoted by the same reference numbers, and a description thereof will not be repeated. In general, suffixes such as "module" and "unit", when are used in the following description, may be used to refer to elements or components for easy preparation of the specification. The use of such suffixes herein is merely intended to facilitate the description of the specification, and the suffixes do not imply any special meaning or function. Furthermore, in the following description of embodiments disclosed herein, if it is decided that a detailed description of known functions or configurations related to the invention would make the subject matter of the invention unclear, such detailed description is omitted. The accompanying drawings are used to assist in easy understanding of various technical features, and it should be understood that the embodiments presented herein are not limited by the accompanying drawings. As such, the present disclosure should be construed to extend to any alterations, equivalents, and substitutes, in addition to those which are particularly set out in the accompanying drawings.

It will be understood that although the terms "first", "second", etc. may be used herein to describe various elements, these elements should not be construed as being limited by these terms. These terms are only used to distinguish one element from another.

It should be understood that, when an element is referred to as being "connected with" another element, there may be intervening elements present, or the element may be directly connected with the another element. In contrast, it should be understood that, when an element is referred to as being "directly connected with" another element, there are no intervening elements present.

A singular representation may include a plural representation unless the context clearly indicates otherwise.

Terms such as "includes" or "has" used herein should be considered as indicating the presence of various features, numbers, steps, operations, elements, components or combinations thereof disclosed in the specification, but it should be understood that the presence or addition of one or more other features, numbers, steps, operations, elements, components or combinations thereof is not excluded.

Figure 1:
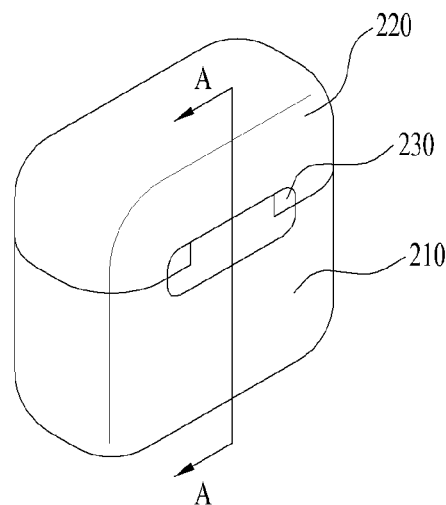
FIG. 1 is a perspective view illustrating a portable sound device according to an embodiment of the present disclosure.
Figure 1:
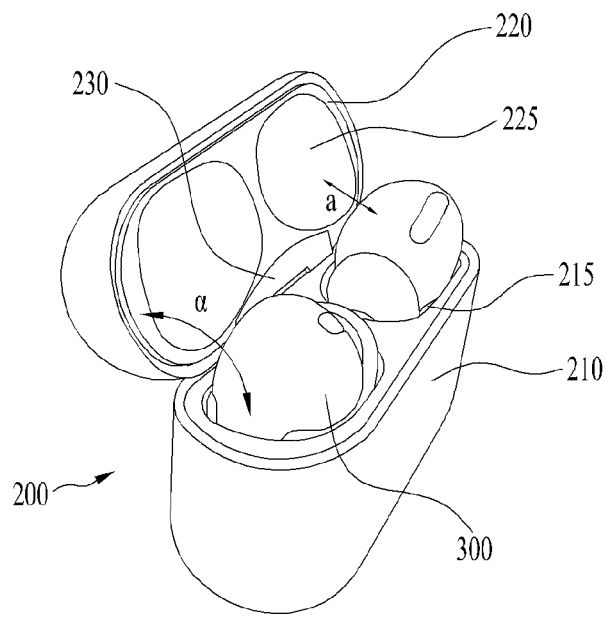
Figure 2:
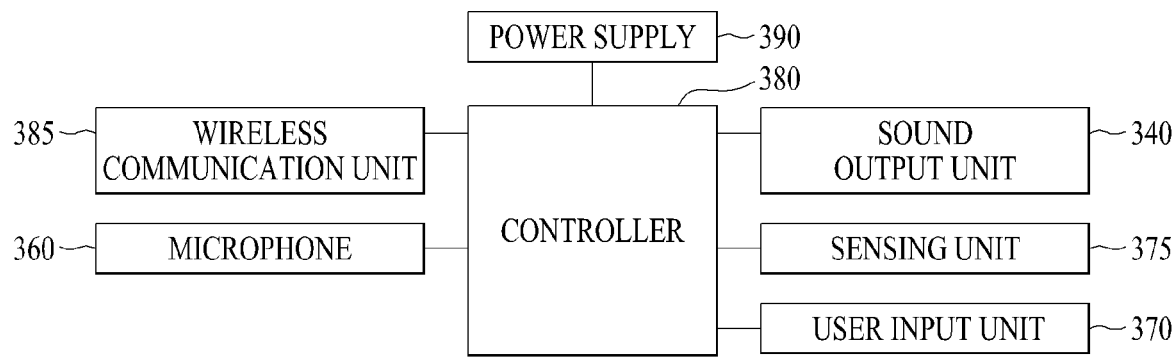
FIG. 2 is a block diagram illustration the construction of earbuds and a cradle according to the present disclosure.
Figure 2:
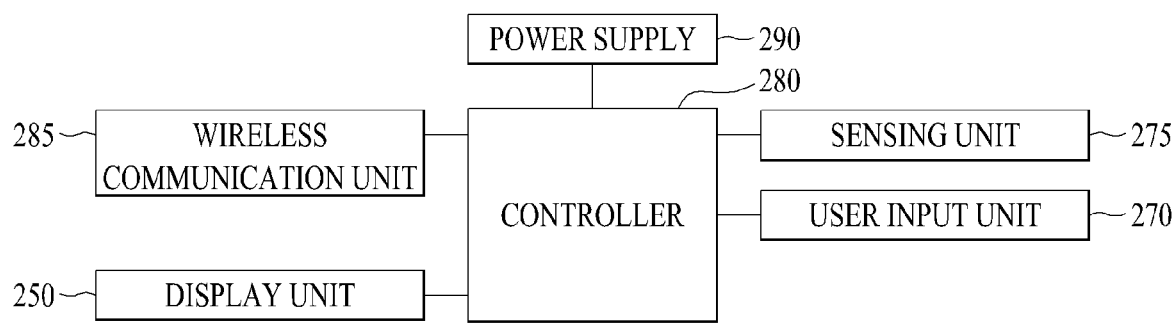

FIG. 1 is a perspective view illustrating a portable sound device 100 according to an embodiment of the present disclosure. FIG. 2 is a block diagram illustrating the configuration of earbuds 300 and a cradle 200 according to an embodiment of the present disclosure.

As illustrated in FIG. 1, the portable sound device 100 according to the present disclosure may include the earbuds 300 and the cradle 200 configured to receive the earbuds 300 therein. The earbuds 300 may be put into a user's ears so as to serve to transmit sound thereto. The earbuds 300 may be inserted into the right ear and the left ear of the user so as to receive sound signals through a short-range communication and to output a sound.

The pair of earbuds 300 may be designed so as be symmetrical with each other. Each of the pair of earbuds 300 may include a controller 380, a wireless communication unit 385, a sound output unit 340, a sensing unit 375, a microphone 360, a user input unit 370, and a power supply 390.

The controller 380 may control the sound output unit 340 to be activated in response to a sound signal received through the wireless communication unit 385, and may control the sound output unit 340 to transmit the sound collected through the microphone 360 through the wireless communication unit 385 or to provide more clear sound by removing the noise from the sound collected through the microphone 360.

In the controller 380, a printed circuit board may be positioned in a housing. Because a plurality of ICs are mounted on the printed circuit board 381, there is a problem in that the thickness thereof is increased when the printed circuit board 381 is disposed so as to overlap a battery. Accordingly, a flexible circuit board may be used in order to dispose the printed circuit board 381 so as not to overlap the battery and to realize mounting and connection of some components, such as the microphone, the user input unit 370, and the sound output unit 340.

Although the wireless communication unit 385 may be connected to a mobile communication base station by itself so as to perform communication, the wireless communication unit 385 may generally be connected to an external device such as a mobile terminal via a short-range communication.

Examples of the short-range communication may include at least one of Bluetooth™, RFID (Radio Frequency Identification), Infrared Data Association (IrDA), Ultra-Wide-band (UWB), ZigBee, Nearfield Communication (NFC), Wi-Fi (Wireless-Fidelity), Wi-Fi Direct, and Wireless USB (Wireless Universal Serial Bus).

The sound output unit 340, which is a device configured to output sound according to a sound signal, may be put into a user's ear so as to serve to transmit sound.

The microphone 360 may process an external sound signal into electric voice data. The processed voice data may be transmitted to an external terminal device or an external server through the wireless communication unit 385. The microphone 360 may realize various denoising algorithm for removing noise generated in the course of receiving external sound signals.

The sensing unit 375, which is a device configured to check the state of the earbuds 300 and ambient circumstances, may include an illuminance sensor configured to detect brightness, a touch sensor configured to detect touch input, a gyro sensor configured to detect a position, an earbud switch configured to detect whether the earbuds are positioned in a cradle 200, and the like.

The user input unit 370 may be an input unit configured to allow a user to control the earbuds 300. In the case of small-sized earbuds 300 according to the present disclosure, it is possible to increase the number of control instructions capable of being input by using touch input, by varying the time and the number of times that each of the limited number of buttons is pressed, or by performing combined input by simultaneously pressing a plurality of buttons.

The power supply 390 may use a button-type battery in order to supply power required for the controller and various components and to be capable of being mounted in a small space. Because the size of the battery determines the operating time of the portable sound device 300, there is a need to ensure as large a space as possible. Accordingly, it is possible to increase a mounting space by disposing some of the boards so as to overlap each other. The power supply 390 may include a power terminal, which is to be connected to an external power source so as to charge the battery. The power terminal may be brought into contact with a power terminal provided at the cradle 200 in which the portable sound device 300 is mounted.

When the capacity of the battery is increased, the battery can be operated for a longer period of time. However, when the capacity of the battery is excessively increased, there is a problem in that the size of earbuds 300 is increased. Because the earbuds 300 must be maintained in the state of being inserted into a user's ears during use, the earbuds 300 may be easily separated from the user's ears or may be difficult to mount in the user's ears when the weight or volume of the earbuds 300 is excessively increased.

Furthermore, because the earbuds 300 have a small size and thus there is the concern of loss thereof, the earbuds 300 may be charged and stored in the case that is the cradle 200, while being carried by a user.

The cradle 200 may include a main body 210 including seating portions 215 into which the earbuds 300 are respectively inserted and a folder body 220 configured to open and close the seating portions 215 in the main body 210. The folder body 220 may be coupled to the main body 210 so as to be openable and closable via a hinge portion 230.

The cradle 200 may include a battery as a power supply 290, and may supply power to the earbuds 300 when the earbuds 300 are inserted into the seating portions 215. The cradle 200 may include ports to which charge cables are connected so as to charge the battery, or may be include a wireless charging coil provided at the main body 210 in order to charge the battery using a wireless charging technology.

Although the wireless communication unit may be provided only at the earbuds 300, the wireless communication unit 285 may also be provided at the cradle 200 in order to perform wireless communication between the cradle 200 and the earbuds 300 or wireless communication between the cradle 200 and a terminal device.

A display unit 250 may include a light for displaying the state of the power supply 290, such a charging state, and a user input unit such a button for opening and closing the folder body 220 or a button for pairing.

A sensing unit 275 may detect whether or not the folder body 220 is opened or whether the earbuds 300 are inserted, and may transmit the detection result to a controller 280.

The state in which the folder body 220 exposes the seating portions 215 may be referred to as an opened state, and the state in which the folder body 220 covers the seating portions 215 may be referred to as a closed state. When the angle between the folder body 220 and the main body 210 is increased in the opened state, there is an advantage of easy removal of the earbuds 300. When the rotational angle of the hinge portion 230 is increased, the seating portions 215 for the earbuds 300 are sufficiently opened, thereby making it easy to insert the earbuds 300 into the seating portions 215 and to take the earbuds 300 out of the seating portion 215.

However, when the rotational angle $\alpha$ of the hinge portion 230 is increased, there is a problem in that the distance a between the main body 210 and the folder body 220 is increased or the size of the hinge portion 230 is increased. In order to ensure that the distance a between the earbuds 300 and the folder body 220 is sufficient to allow a finger of a user to be inserted thereinto, it is preferable that the folder body 220 be capable of being rotated 90° or more with respect to the main body 210.

Figure 3:
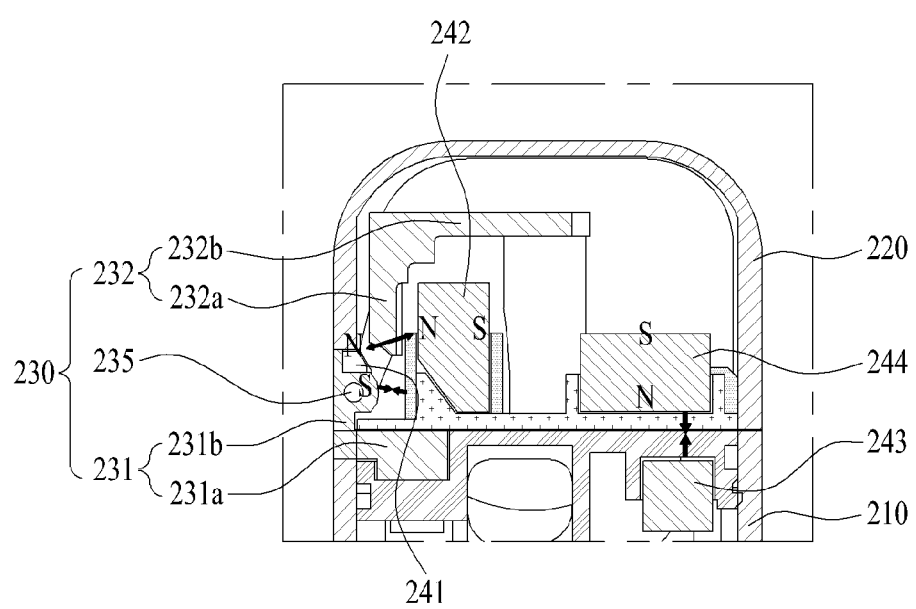
FIG. 3 is a cross-sectional view taken along line A-A in FIG. 1.

FIG. 3 is a cross-sectional view taken along line A-A in FIG. 1, which illustrates the interior of the folder body 220 and the state in which the folder body 220 and the main body 210 are coupled via the hinge portion 230. Because the earbuds 330 may project upwards in the state in which the earbuds 330 are inserted into the seating portions 215, as illustrated in FIG. 1, in order to allow the earbuds 330 to be easily taken out of the seating portions 215, the folder body 220 may have a thickness sufficient to cover the earbuds 300.

Assuming that the surface of the main body 210 in which the seating portions 215 are formed is referred to as an upper surface, the folder body 220 may be coupled to the main body 210 so as to cover the upper surface, and the hinge portion 230 may be positioned at first sides of the main body 210 and the folder body 220.

The hinge portion 230 may include a first hinge 231, coupled to the main body 210, a second hinge 232, coupled to the folder body 220, and a shaft 235, extending through the first hinge 231 and the second hinge 232 and rotatable therein. The shaft 235 may be positioned at the main body 210, at the folder body 220, or between the main body 210 and the folder body 220.

When the shaft 235 is positioned between the main body 210 and the folder body 220, the boundary surface of the main body 210 or the folder body 220 must be cut in order to prevent the shaft 235 from projecting outwards from the main body 210 and the folder body 220 or to prevent the main body 210 and the folder body 220 from interfering with each other, as in a typical hinge.

Figure 4:
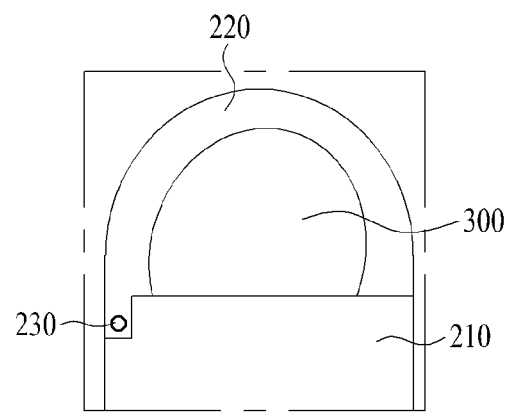
FIGS. 4 to 6 are views illustrating operation of opening and closing a folder body with respect to a main body of a portable sound device according to various embodiments of the present disclosure.
Figure 4:
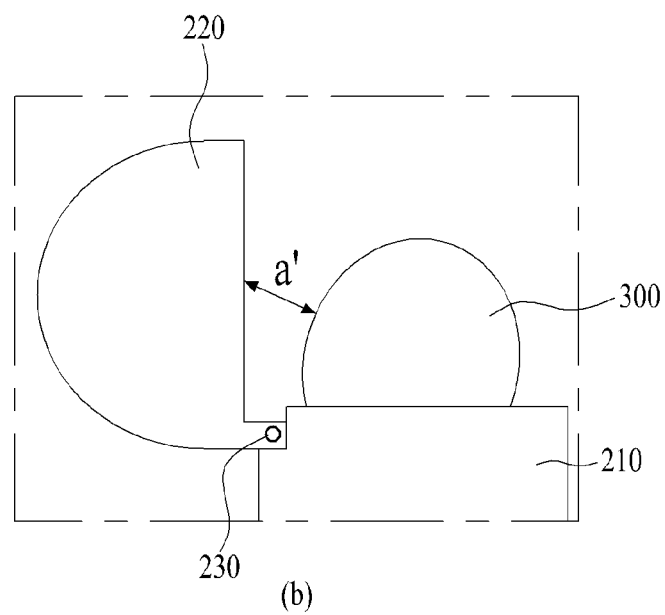
Figure 5:
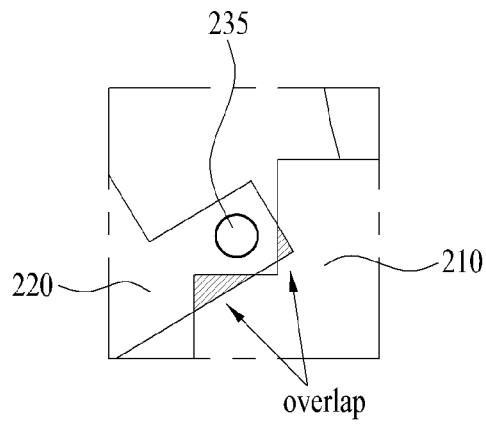
Figure 5:
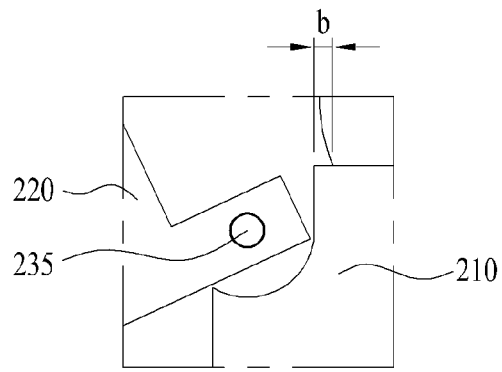
Figure 5:
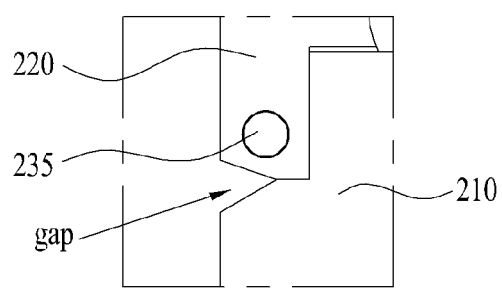
Figure 6:
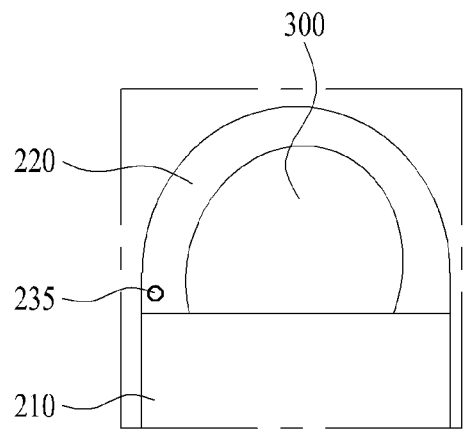
Figure 6:
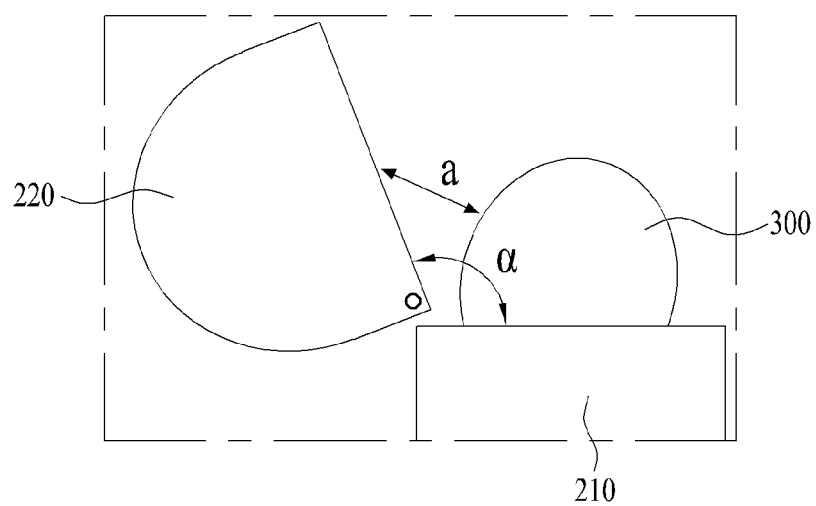

FIGS. 4 to 6 are views illustrating the opening and closing operation of the folder body with respect to the main body in the portable sound device according to various embodiments of the present disclosures.

In the embodiment shown in FIG. 4, the shaft 235 is positioned at the main body 210. When the surface of the main body 210 and the surface of the folder body 220 that face each other are positioned in the same plane in the closed state as shown in FIG. 4(*a*), the folder body 220 cannot actually be opened to 90° or more because the end of the folder body 220 interferes with the main body 210 in the opened state as shown in FIG. 4(*b*).

In this case, it is insufficient to allow a user's finger to be inserted therebetween because the distance a' between the earbud 300 and the folder body 220 is too small.

Because the folder body 220 interferes with the main body 210 when the folder body 220 is opened to 90° or more, the main body 210 must be cut as shown in FIG. 5(*b*), or a gap must be formed between the main body 210 and the folder body 220 as shown in FIG. 5(*c*).

This design has problems of difficult manufacture, deteriorated durability, and formation of a groove, which mars the appearance thereof. Accordingly, the present disclosure is capable of ensuring a rotational space for rotation of the folder body 220 by disposing the shaft 235 at the folder body 220 and utilizing the gap between the earbuds 330 and the shaft 235, as shown in FIG. 6(*a*).

In the opened state shown in FIG. 6(*b*), the angle α between the folder body 220 and the main body 210 may be increased to about 101°, and the distance a between the earbuds 300 and the folder body 220 may also be increased to 12.61 mm, in contrast to about 2 mm, as in the design shown in FIG. 5.

The hinge portion 230 according to the present disclosure may be made of a metal material. Because the metal material has high rigidity, the hinge portion 230 may be difficult to break even when the hinge portion 230 is configured to have a small thickness. However, when the hinge portion 230 is made through injection molding, the hinge portion 230 may require a greater thickness than a hinge portion made of metal in order to ensure sufficient rigidity.

Figure 7:
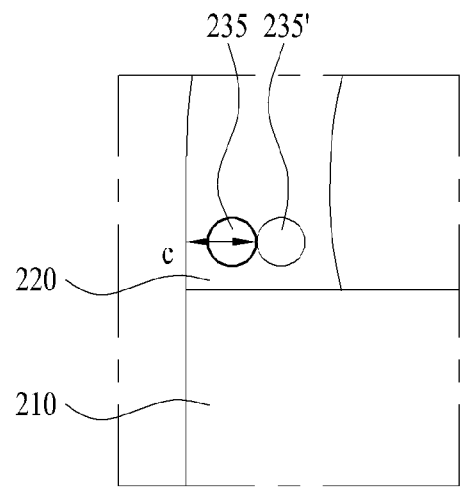
FIG. 7 is a view illustrating operation of opening and closing the folder body with respect to the main body of the portable sound device in the case in which a shaft is positioned further inwards from the outer surface of the folder body.
Figure 7:
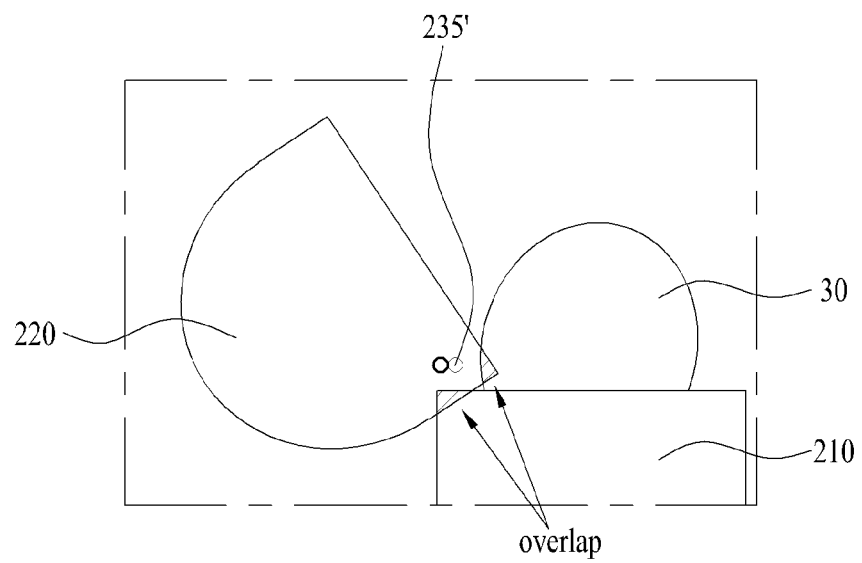

FIG. 7 is a view of an opening and closing operation of the folder body with respect to the main body in the portable sound device in the case in which the shaft is positioned at a point spaced further inwards apart from the outer surface of the folder body 220.

As illustrated in FIG. 7(*a*), the shaft 235 must be further spaced apart from the outer surface of the folder body 220 than the metal hinge portion 230. In this case, the folder body 220 overlaps the earbuds 300 because the distance between the earbuds 300 and the shaft 235 is decreased, and the folder body 220 interferes with the main body 210 because the rotational distance of the folder body 220 is increased, as illustrated in FIG. 7(*b*).

Accordingly, it is possible to minimize the increase in the size of the cradle 200 in the case in which the hinge portion 230 includes a metal material.

When the shaft 235 is positioned at the folder body 220, the first hinge 231 may include a first portion 231*a* coupled to the main body 210 and a second portion 231*b* which projects upwards (in the direction of the folder body 220) and overlaps the second hinge 232 in a horizontal direction, as illustrated in FIG. 3).

The second hinge 232 may include a third portion 232*a*, which is disposed parallel to the second portion 231*b* and through which the shaft 235 extends, and a fourth portion 232*b* fixed to the folder body 220. The fourth portion 232*b* may extend and be stably fixed to the folder body 220 by means of a screw. This extension of the second hinge 232 may enable rotative force to be easily transmitted to the folder body 220.

In order to maintain the folder body 220 in the closed state, a locking magnet 244 may be provided at the side of the folder body 22 opposite the side at which the hinge portion 230 is positioned, and a metal body 243 or a magnet, which has at a surface facing the locking magnet 244 a polarity opposite the polarity of the facing surface of the locking magnet 244 facing the same, may be provided at the portion of the main body 210 that faces the locking magnet 244 in the closed state.

When the folder body 220 is opened by a force greater than the magnetic force of the locking magnet 244, the hinge portion 230 may be rotated, and the folder body 220 may be opened. Here, when the folder body 220 is configured in a semi-automatic manner such that the folder body 220 is subjected to a force required to open the folder body 220 when the folder body 220 is pushed beyond a predetermined angle by a user, convenience in use is improved.

In order to configure the folder body 220 to be opened and closed in a semi-automatic manner, an elastic element such as a spring may be used. However, when the elastic element is used, the number and volume of parts is increased, and manufacturing costs are increased.

The present disclosure may be embodied so as to be semi-automatic using a magnet, as illustrated in FIG. 3. The magnet may include a first magnet 241 coupled to the first hinge 231 and a second magnet 242 coupled to the second hinge 232 or the folder body 220. The first magnet 241 and the second magnet 242 may be oriented such that the surfaces of the first magnet 241 and the second magnet 242 that face each other have the same polarity in order to maintain a repulsive force therebetween. Although the N pole is illustrated in the drawing, the first and second magnets may be oriented such that the S pole of the first magnet 241 faces the S pole of the second magnet 242, which will be referred to as a first pole, without being limited thereto.

Figure 8:
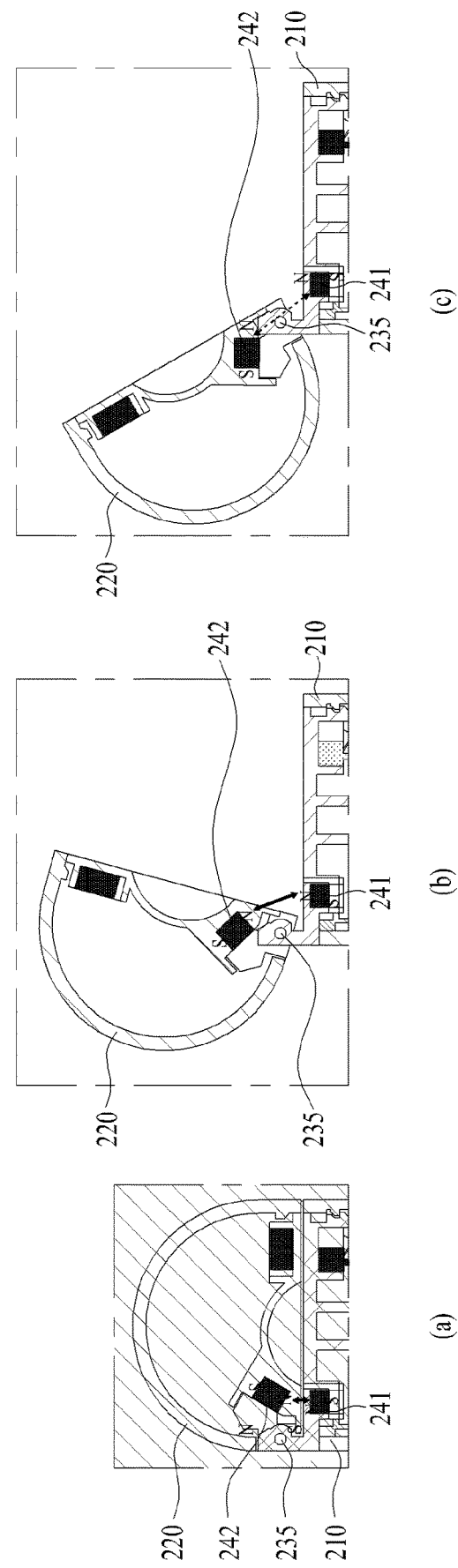
FIG. 8 is a view illustrating another embodiment of a first magnet and a second magnet of the cradle.

FIG. 8 is a view illustrating another orientation of the first magnet 241 and the second magnet 242. Unlike FIG. 3, the first magnet 241 is coupled to the main body 210 or the first portion 231*a* of the first hinge 231 coupled to the main body 210.

In this case, although the size of the first magnet 241 may be freely controlled and the first pole of the first magnet 241 and the first pole of the second magnet 242 may be disposed at the closest location with respect to each other throughout the rotation of the folder body 220, the distance between the first magnet 241 and the second magnet 242 may be gradually increased as the folder body 220 is opened, as illustrated in FIGS. 8(*a*) to 8(*c*).

When the distance between the first magnet 241 and the second magnet 242 is increased, the repulsive force between the two magnets is decreased and thus the repulsive force applied to the second magnet 242 is decreased, thereby changing from the state shown in FIG. 8(*b*) to the state shown in FIG. 8(*c*). In addition, because the repulsive force between the first magnet 241 and the second magnet 242 is decreased in the opened state shown in FIG. 8(*c*), there is a problem in that the angle of the folder body 220 is not maintained at a certain value and the folder body 220 is easily moved.

Accordingly, the first magnet 242 according to the present disclosure is coupled to the first hinge 231 close to the shaft 235, as illustrated in FIG. 3. In this embodiment, because the size of the first magnet 241 is decreased due to space restrictions, attractive force may be generated between the second pole of the first magnet 241 and the first pole of the second magnet 242. In this state, because the distance between the first pole of the first magnet 241 and the first pole of the second magnet 242 is less than the distance between the second pole of the first magnet 241 and the first pole of the second magnet 242, a repulsive force stronger than the attractive force may be applied to the folder body 220. However, it is possible to maintain the closed state by virtue of the magnetic force of the locking magnet 244, despite the repulsive force between the first magnet 241 and the second magnet 242.

Figure 9:
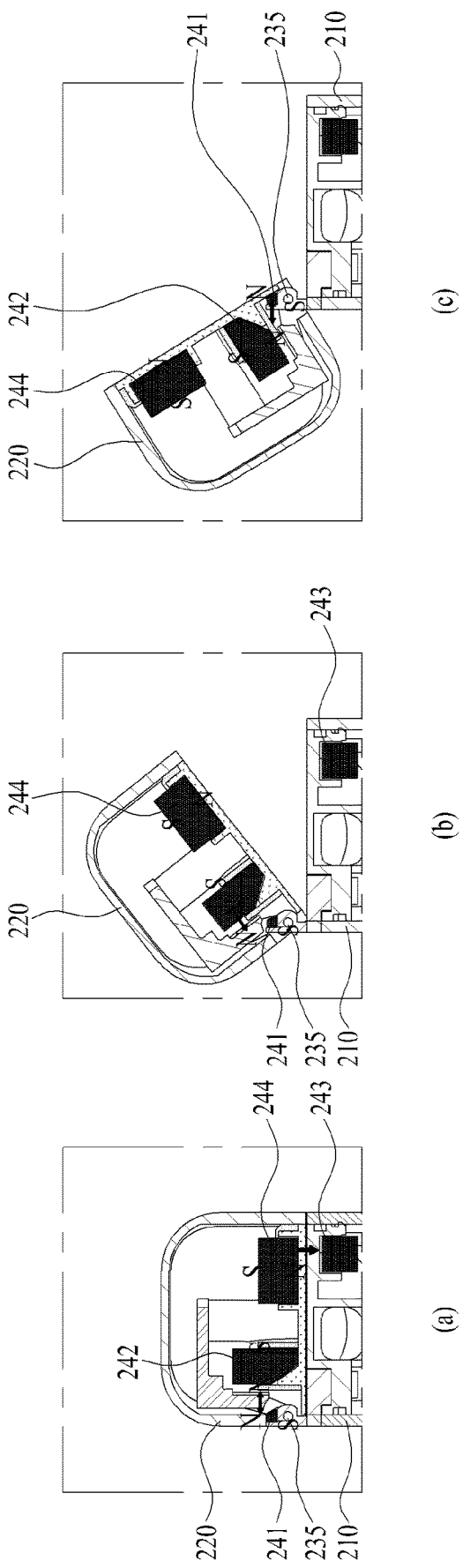
FIG. 9 is a view illustrating the opening operation of the folder body of the cradle having a hinge portion.

FIG. 9 is a view illustrating an opening operation of the folder body 220 of the cradle 200 having the hinge portion 230. FIG. 10 is an enlarged view illustrating the orientation of the first magnet 241 and the second magnet 242 in more detail.

Because the shaft 235 according to the embodiment is positioned close to the outer surface of the folder body 220, the folder body 220 may not interfere with the main body 210 during rotation thereof, and may be completely opened. In addition, the surface of each of the first magnet 241 and the second magnet 242 that corresponds to the first pole may include two surfaces, which define an obtuse angle therebetween, such that the first pole of the first magnet 241 faces the first pole of the second magnet 242 in all stages.

Because the two facing surfaces have different poles when the surface of the first magnet 241 and the surface of the second magnet 242 define an acute angle, the two facing surfaces may define an obtuse angle therebetween. The first magnet 241 may include a first surface 241a, which is inclined so as to face the second magnet 242, and a second surface 241b, which faces upwards.

The second magnet 242 may include a third surface 242a close to the first surface 241a in the closed state and a fourth surface 242b close to the second surface 241b in the opened state. In the closed state shown in FIG. 10(a), the first surface 241a may face an inclined upward direction based on a diagonal line, the second surface 241b may face an upward direction, the third surface 242a may face a leftward direction, and the fourth surface 242b may face a leftward and downward direction.

Because the first magnet 241 is disposed in a small space in the first hinge 231 positioned above the shaft 235, the first magnet 241 must have a small size. Accordingly, in order to ensure sufficient magnetic force, the size of the second magnet 242 may be increased compared to the size of the first magnet 241. When the folder body 220 is opened while the first surface 241a faces the third surface 242a in the closed state shown in FIG. 10(a), whereby the corner between the first surface 241a and the second surface 241b faces the corner between the surface 242a and the fourth surface 242b, the distance between the first magnet 241 and the second magnet 242 becomes the shortest.

At this time, the repulsive force between the first magnet 241 and the second magnet 242 is maximized, thus causing rotation of the folder body 220 about the hinge portion 230. Consequently, the repulsive force may be applied so as to assist the operation of opening the folder body 220 while the folder body 220 is opened, and may be applied so as to assist in closing the folder body 220 while the folder body 220 is closed. In the opened state shown in FIG. 10(c), although the second surface 241b and the fourth surface 242b are positioned so as to be close to each other, the distance therebetween is less than the distance in the state shown in FIG. 10(b), whereby the repulsive force is decreased. The repulsive force between the first magnet 241 and the second magnet 242 in the completely opened state maintains the folder body 220 in the opened state, thereby allowing the earbuds 330 to be easily put into the seating portion 215.

As is apparent from the foregoing description, the first magnet 241 and the second magnet 242 according to the present disclosure may continuously provide repulsive force to assist the folder body 220 in a semi-automatic opening and closing operation and to maintain the folder body 220 in the opened state.

Since the cradle 200 according to the present disclosure has a simplified semi-automatic opening and closing structure in which the number of parts is decreased, it is possible to simplify the manufacturing process and reduce the manufacturing costs.

Furthermore, by virtue of the structure capable of minimizing the interference between the folder body 220 and the main body 210, it is possible to reduce the size of the cradle 200.

In addition, since the hinge is made of a metal material, the durability of the portable sound device is improved and the number of parts is reduced, thereby making it possible to reduce the incidence of defects and malfunctions.

The above detailed description should be construed in all aspects as illustrative and not restrictive. The scope of the present disclosure should be determined by rational interpretation of the appended claims, and all of alternatives, modifications, equivalents, and other embodiments that are included within the equivalent scope of the present disclosure should be construed as falling within the spirit and scope of the present disclosure.

What is claimed is:

1. A cradle comprising:
   a main body having a seating portion in which an earbud is seated;
   a folding body capable of being converted between a closed state in which the folding body covers the seating portion and an opened state in which the folding body opens the seating portion; and
   a hinge portion configured to hingedly couple the folding body to the main body,
   wherein the hinge portion comprises:
   a first hinge coupled to the main body;
   a second hinge coupled to the folding body;
   a shaft extending through the first hinge and the second hinge;
   a first magnet coupled to the first hinge; and
   a second magnet coupled to the second hinge or the folding body, and
   wherein the first magnet and the second magnet are disposed so as to maintain a repulsive force therebetween while the folding body is converted into the opened state from the closed state, and
   wherein a first polarity of the first magnet and the first polarity of the second magnet face each other in both of the closed state and the open state.

2. The cradle according to claim 1, wherein a shortest distance between the first magnet and the second magnet decreases and then increases when the folding body is converted from the closed state to the opened state.

3. The cradle according to claim 1, wherein the first magnet includes a first surface and a second surface each having the first polarity, the first surface and the second surface defining an obtuse angle of more than 90° therebetween, and wherein the second magnet includes a third surface and a fourth surface each having the first polarity, the third surface and the fourth surface defining an obtuse angle of more than 90°.

4. The cradle according to claim 3, wherein the first surface and the third surface face each other in the closed state, and the second surface and the fourth surface face each other in the opened state.

5. The cradle according to claim 1, wherein the shaft is positioned at the folding body.

6. The cradle according to claim 1, wherein the first hinge includes a first portion coupled to the main body and a second portion projecting toward the folding body, and the shaft is coupled to the second portion of the first hinge.

7. The cradle according to claim 6, wherein the second hinge includes a third portion, which is positioned parallel to the second portion and through which the shaft extends, and a fourth portion, which extends from the third portion and is fixed to the folding body.

8. The cradle according to claim 1, wherein the folding body and the main body define an angle greater than 90° therebetween in the opened state.

9. The cradle according to claim 1, wherein the hinge portion includes a metal material.

10. The cradle according to claim 1, wherein the hinge portion is positioned at one side of the main body, and
wherein the cradle further comprises a wireless charging antenna positioned at the one side of the main body.

11. A portable sound device comprising:
a pair of earbuds each having a sound output unit; and
a cradle having seating portions in which the pair of earbuds are seated,
wherein the cradle comprises:
a main body having formed therein the seating portions;
a folding body capable of being converted between a closed state in which the folding body covers the seating portion and an opened state in which the folding body opens the seating portion; and
a hinge portion configured to hingedly couple the folding body to the main body,
wherein the hinge portion comprises:
a first hinge coupled to the main body;
a second hinge coupled to the folding body;
a shaft extending through the first hinge and the second hinge;
a first magnet coupled to the first hinge; and
a second magnet coupled to the second hinge or the folding body, and
wherein the first magnet and the second magnet are disposed so as to maintain a repulsive force therebetween while the folding body is converted into the opened state from the closed state, and
wherein a first polarity of the first magnet and the first polarity of the second magnet face each other in both of the closed state and the open state.

12. The portable sound device according to claim 11, wherein the first magnet is coupled to the first hinge close to the shaft.

13. The portable sound device according to claim 11, wherein a distance between the first magnet and the second magnet is minimized when the folding body is in an intermediate state between the closed state and the opened state.

14. The portable sound device according to claim 11, wherein the first magnet includes a first surface and a second surface each having a first polarity, the first surface and the second surface defining an obtuse angle of more than 90° therebetween,
wherein the second magnet includes a third surface and a fourth surface each having the first polarity, the third surface and the fourth surface defining an obtuse angle of more than 90°, and
wherein the first surface and the third surface face each other in the closed state, and the second surface and the fourth surface face each other in the opened state.

15. The portable sound device according to claim 11, wherein the pair of earbuds project partway out of the seating portions, and
wherein the folding body and the main body define an angle greater than 90° therebetween in the opened state.

16. The cradle according to claim 3, wherein
the first surface faces inclined upward to face the second magnet,
the second surface faces upward direction,
the third surface faces side direction, and
the fourth surface faces inclined downward to face the first magnet.

17. The cradle according to claim 6, wherein the first magnet is coupled to the second portion of the first hinge.

* * * * *